RELAY MOUNTING SOCKET WITH PRINTED CIRCUIT BOARD

Filed March 6, 1968

INVENTOR.
JACK V. FOSTER
BY Charles J. [signature]
AGENT

United States Patent Office

3,523,268
Patented Aug. 4, 1970

3,523,268

RELAY MOUNTING SOCKET WITH PRINTED CIRCUIT BOARD

Jack V. Foster, Fort Branch, Ind., assignor to American Machine & Foundry Company, a corporation of New Jersey Filed Mar. 6, 1968, Ser. No. 710,971
Int. Cl. H05k *1/07, 7/10*
U.S. Cl. 339—17 10 Claims

ABSTRACT OF THE DISCLOSURE

A mounting socket for an electrical plug-in device having a base of dielectric material with a printed circuit board embedded therein and detachable circuit connecting means for the conductors of the printed circuit board, and a socket means for the plug-in device being connected to the base and having contacts conductively connected to the conductors of the printed circuit board.

This invention relates generally to circuits having plug-in components and more particularly to socket means therefor.

Heretofore, sockets for electrical plug-in components have been riveted or similarly connected to supporting structure or the dielectric card in the case of printed circuits, and the socket contacts extending therefrom were soldered to wire lead terminals or to printed conductor terminals. While this type of construction provides a desired fixed support with good electrical connections, replacement or relocation of such a socket is a difficult major repair.

While socket connectable in circuits may be used for many types of electrical plug-in components and may be of various well-known shapes and sizes, a rectangular socket commonly used for canned plug-in relays will be used for purposes of description. It should be understood, however, that the specific type of socket, its shape, number of contacts nor the type of component to be supported thereby are to be construed as defining the limits of the present invention.

Accordingly, an object of the present invention is to provide an improved mounting socket for an electrical plug-in component to be embodied in a circuit.

Another object of the present invention is to provide a mounting socket which is connectable to circuit support means and is detachable therefrom.

And another object of the present invention is to provide the foregoing socket with means for being releasably connected to selective conductors of a circuit.

The present invention contemplates a mounting socket for an electrical plug-in component comprising a socket member of dielectric material having a plurality of openings therethrough to receive contacts extending from a component to be supported thereby; a plurality of contact members each disposed in a different opening and engaging a contact inserted therein to provide an electrically conductive connection, each contact member having a terminal portion extending therefrom and beyond the socket member; a printed circuit board of dielectric material and having a plurality of conductor portions exposed at one surface of the circuit board and extending from at least one edge thereof toward the opposite edge thereof; the conductor portions being electrically isolated from each other and providing a series of spaced terminals along the circuit board edge from which they extend; means fixedly connecting the socket member to the circuit board against its other surface so the contact member terminals extend therethrough; the circuit board having a plurality of openings therethrough and through the conductor portions and being aligned to pass each contact member terminal through a different conductor portion remote from its terminal; means for fixedly connecting each of the contact member terminals to the conductor portion through which it passes to provide an electrically conductive connection therebetween; a base member of dielectric material encapsulating the circuit board having a lower portion and an upper portion each extending past one of the surfaces of the circuit board; the lower portion having a central opening exposing the connections between the contact member terminals and the conductor portions, and a plurality of end slots each exposing a different one of the conductor portion terminals; the upper portion having a central opening of sufficient size and shape to receive the socket member and a plurality of end slots corresponding to the end slots of the lower portion; the base member and circuit board having aligned openings therethrough for mounting connector means; and a plurality of releasable terminal connector means each disposed in a different slot in the lower portion and the slot corresponding thereto, being in contact with the conductor portion terminal exposed by the slot.

The foregoing and other objects and advantages of the invention will appear more fully hereinafter from a consideration of the detailed description which follows, taken together with the accompanying drawings wherein several embodiments of the invention are illustrated by way of example. It is to be expressly understood, however, that the drawings are for illustration purposes only and are not to be construed as defining the limits of the invention.

Figures 1, 2, 3, 4, 5, 6:
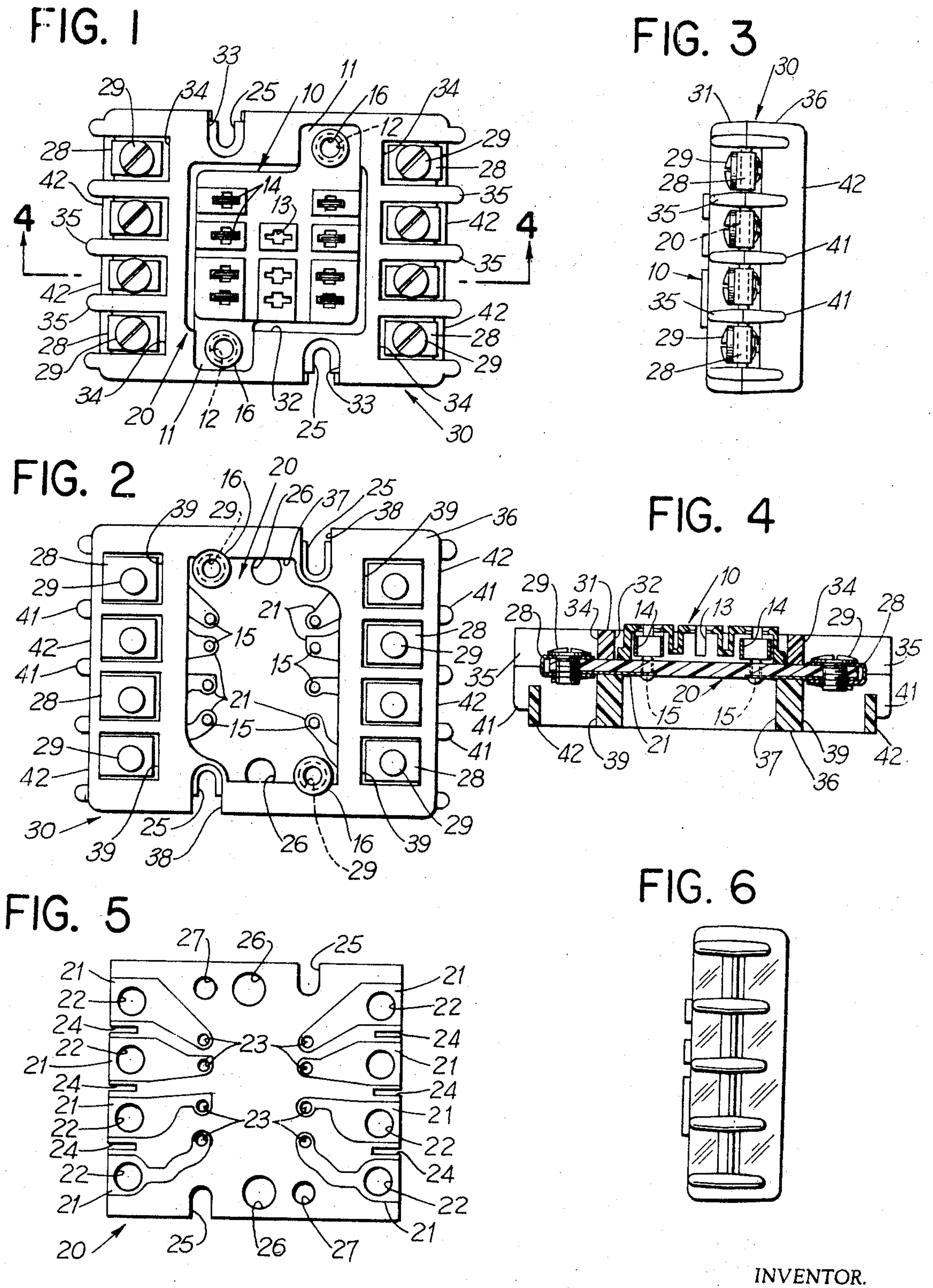
FIGS. 1 and 2 are top and bottom plan views of a mounting socket, for an electrical component, made in accordance with the present invention.
FIG. 3 is an end view of the novel mounting socket.
FIG. 4 is a sectional view taken on line 4—4 of FIG. 1.
FIG. 5 is a bottom plan view of a printed circuit board embodied in the novel mounting socket.
FIG. 6 is a view similar to FIG. 3 illustrating another form of mounting socket in accordance with the present invention.

Referring now to the drawings a novel mounting socket, in accordance with the present invention, has three major parts, namely: a female or socket member or portion 10, a printed circuit board or board portion 20, and a base or base portion 30. While the socket 10, as shown, is a molded rectangular member of the type commonly used for a canned plug-in relay, an octal or another form of socket member may be embodied in the novel mounting socket depending upon the requirements of the electrical component for which the socket member is provided.

The socket member 10 is a molded form of a dielectric material having a plurality of slots 13 which may be arranged in any desired manner suitable to receive the prongs or male contacts of the electrical device or component (not shown) to be plugged-in and supported thereby. The usual female contact 14 is provided in each of the slots 13 as is required and, in this instance, each contact has a depending prong or terminal 15 which extends past the bottom of the socket member 10. A pair of ears or mounting flanges 11, each with an opening 12, extend from opposite edges of the socket member 10 as shown in FIG. 1.

The printed circuit board 20, in this instance is a rectangular dielectric member with a pair of opposed edges a little shorter than the other pair of opposed edges which will be discussed herein as the longer edges. Conductive material is provided on the bottom surface of the board 20, by any means well known in the art for making printed circuit boards, to provide a plurality of conductor portions or connectors 21, each being electrically isolated from the others. For illustration purposes, eight of such conductor portions 21 are provided and may be of any planar shape desired.

The conductor portions 21 may extend from one or more edges and, in this instance, four of the conductor portions, each spaced from the others, extend from each of the shorter edges of the board 20 where they provide spaced terminals toward the other of the shorter edges thereof and have inner ends which are spaced from the inner ends of the conductor portions 21 which extend from the other of the shorter edges. A plurality of spaced slots 24 are provided in each of the shorter edges of board 20, each of the slots 24 being disposed between a different adjacent pair of terminals of the conductor portions 21. A plurality of larger openings 22 and smaller opening 23 extend through the board 20. Each of the openings 22 also extends through the terminal end of a different conductor portion 21 adjacent a shorter side of the board 20 while each of the smaller openings 23 also extends through the inner end of a different conductor portion.

A suitable open end slot 25 is provided in each of the longer edges of the board 20. A pair of openings 27 are provided in board 20 each adjacent one of the longer edges and spaced from a slot 25 while a larger opening 26 is provided between each slot 25 and the opening 27 spaced therefrom.

The printed circuit board 20 is permanently positioned or substantially encapsulated in a base or base member 30 of the same general configuration but larger to extend laterally past the circuit board edges, and having portions 31 and 36 which extend upwardly and downwardly, respectively, past the surfaces of the board. Base member 30 is molded of a suitable dielectric material with its upper portion 31 and lower portion 36 permanently joined together by rivets, cement or other suitable means. Alternatively, the base member 30 can be molded around the printed circuit board 20 as is illustrated in FIG. 6.

The upper portion 31 and lower portion 36 are provided with large central openings 32 and 37, respectively, opening 32 being of sufficient size and shape to receive the socket member 10 while the opening 37 exposes the inner ends of the conductor portions 21.

When the socket member 10 is positioned in the opening 37, it abuts the top surface of the printed circuit board 20 and openings 12 in the socket member ears 11 are aligned with corresponding openings 27 in the circuit board. A fastening means 16, such as a rivet or eyelet which is upset at both ends, extends through each opening 12 and the aligned opening 27 to fixedly connect the socket member 10 to the board 20.

The openings 23 are positioned for alignment with the prongs or terminals 15 extending from the female contacts 14 so that each of the contact prongs or terminals extends through the inner end of a different conductor portion 21 when the socket member 10 is properly fitted in the opening 32 and connected to the board 20. The opening 37 exposes the contact prongs 15 and permits their being soldered or otherwise suitably joined to the inner ends of the conductor portions 21 to conductively connect each of the female contacts 14 in the slots 13 of socket member 10 to a different one of the conductor portions.

A plurality of open end slots 34, in this instance there are four, are provided in each of the shorter edges of the upper base portion 31 which form a plurality of rib portions 35 each disposed between an adjacent pair of the slots 34. The lower base portion 36 has a plurality of slots 39 corresponding to and being aligned with the slots 34. Resulting rib portions 41 are thereby formed which correspond to and are aligned with the rib portions 35. The lower base portion 36 is preferably provided with a wall 42 which extends across each of its shorter ends, terminates below the bottom or printed surface of the circuit board 20 and forms a reinforcing web adjacent the ends of the rib portions 41.

The ends of the conductor portions 21 adjacent the shorter edges of board 20 and the openings 22 therethrough are each exposed by a different one of the slots 39 while corresponding portions of the upper surface of the circuit board 20 are exposed by the slots 34.

The upper and lower base portions 31 and 36 are each provided with a pair of open end slots 33 and 38, respectively, which are aligned with slots 25 of the contact board 20. Slots 36 are substantially equal in width to slots 25 while slots 33 are wider and thereby expose portions of the top surface of circuit board 20. The novel mounting socket is connected to a supporting structure by releasable fastening means (not shown) the shanks of which extend through slots 25 and 28 and the heads of which are disposed in slots 33 and seat on the exposed upper surface therein of the circuit board 20.

The base 30 preferably has protruding portions which extend into slots 24 and openings 26 in the circuit board 20 to provide an interlock therebetween.

Terminal means are provided for releasably connecting the ends of wire conductors (not shown) to the ends of the conductor portions 21 exposed by slots 39. The terminal means for each of the conductor portions 21 comprises a U-shaped spring clip type sheet metal nut 28 with aligned openings in the legs of the U form, and a terminal screw 29. One of the nuts 28 is positioned on each of the portions of the printed circuit board 20 exposed by aligned slots 34 and 39 with one of its legs in contact with the exposed end of the conductor portion 21 thereat and the openings alined with the corresponding opening 22. One of the terminal screws 29 is inserted through the opening in the upper leg of each nut 28 and the aligned opening 22, and threadedly engages the opening in the leg of the nut in contact with the conductor portion 21. Although not shown, the terminal means may include one side of a two piece solderless plug-in terminal arrangement.

Although but a single embodiment of the invention has been illustrated and described in detail, it is to be expressly understood that the invention is not limited thereto. Various changes may also be made in the design and arrangement of the parts without departing from the spirit and scope of the invention as the same will now be understood by those skilled in the art.

I claim:

1. A mounting socket for an electrical plug-in device comprising:

a board having a plurality of conductors on one face thereof, each conductor having an outer end and an inner end;

said outer ends being disposed in spaced series along at least one edge of said board and having detachable terminal means associated therewith, whereby a releasable connection may be made with each of said conductors;

a socket mounted on the opposite face of said board, said socket having contacts disposed in bores in the body thereof for engagement with terminals on a plug-in- device;

means connecting said contacts to said inner ends of said conductors; and a base receiving said board, said base having a plurality of slots along at least one side thereof and each of said slots receiving and exposing one of said detachable terminal means;

said base further having a central opening therethrough exposing a portion of each side of said board, the opening on one side receiving said socket and the opening on the other side providing access to said inner ends of said conductors.

2. The mounting socket in accordance with claim 1, wherein:

said base has at least two openings therethrough each at an edge of said base opposite from the other to receive fastening means for releasably connecting said mounting socket to circuit supporting structure.

3. The mounting socket in accordance with claim 1, wherein:

the slots in the one end of said base expose corresponding portions of both sides of said board including the exposed terminal end portions; and said terminal means each having a U-shaped portion disposed in a different one of said slots which engages both sides of said board and conductively contact said terminal end portion exposed by said slot.

4. The mounting socket in accordance with claim 3, wherein:

said base provides a wall of dielectric material between adjacent terminal means.

5. The mounting socket in accordance with claim 1, wherein:

the conductors of said board provides a first conductor set and said terminal means provides a first terminal set;

said board having a plurality of conductors providing a second conductor set;

a plurality of terminal means providing a second terminal set disposed in spaced series along the edge of said printed circuit board means opposite from said first terminal set and connected to said conductors thereat of said second set each providing a releasable conductive connection for a different one of said conductors of said second set to a circuit conductor.

6. The mounting socket in accordance with claim 5, wherein:

slots are provided along opposite sides of said base, said slots exposing portions of both sides of said board including said terminal means; and said terminal means comprising a U-shaped portion disposed in each of said slots, which engages both sides of said board and conductively contacts said outer end of said conductor.

7. The mounting socket in accordance with claim 6, wherein:

said base provides a wall of dielectric material between adjacent terminal means.

8. The mounting socket in accordance with claim 1, and said means connecting said contacts and said inner ends comprising:

an opening extending through each said inner end and said board, each opening being aligned with a contact of said socket and receiving a prong extending from said contact, said inner ends and said prongs being conductively connected.

9. The mounting socket in accordance with claim 1, wherein:

an opening is provided through said outer end of each of said conductors and said board, and said detachable terminal means includes a clamping screw extending through said hole.

10. The mounting socket in accordance with claim 1, wherein:

said base is molded about said board.

References Cited

UNITED STATES PATENTS

| | | | |
|---|---|---|---|
| 2,651,833 | 9/1953 | Kernahan. | |
| 2,984,697 | 5/1961 | Bontecue et al. | |
| 2,814,024 | 11/1957 | Narozny. | |
| 2,825,010 | 2/1958 | Silverschotz. | |
| 2,907,926 | 10/1959 | Slacks. | |
| 2,968,780 | 1/1961 | Roswell | 339—17 |
| 3,219,885 | 11/1965 | Schniers | 317—100 |

RICHARD E. MOORE, Primary Examiner

P. A. CLIFFORD, Assistant Examiner

U.S. Cl. X.R.

317—101; 339—193, 219, 220, 263